United States Patent
Chen

(10) Patent No.: US 11,146,088 B2
(45) Date of Patent: Oct. 12, 2021

(54) POWER CONTROL CIRCUIT AND POWER CONTROL METHOD

(71) Applicant: Acer Incorporated, New Taipei (TW)

(72) Inventor: Shang-Hui Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 99 days.

(21) Appl. No.: 16/590,388

(22) Filed: Oct. 2, 2019

(65) Prior Publication Data
US 2020/0412151 A1 Dec. 31, 2020

(30) Foreign Application Priority Data
Jun. 27, 2019 (TW) .............................. 108122721

(51) Int. Cl.
*H02J 7/00* (2006.01)

(52) U.S. Cl.
CPC .......... *H02J 7/0068* (2013.01); *H02J 7/0029* (2013.01)

(58) Field of Classification Search
CPC ...... H02J 7/0068; H02J 7/0029; H02J 7/0047; H02J 7/0063; H02J 7/0031; H02H 3/025; H02H 3/20; H02H 3/08; H02H 5/04; H02H 7/18; H03K 17/04123; H03K 17/0822
See application file for complete search history.

(56) References Cited

U.S. PATENT DOCUMENTS

| | | | | |
|---|---|---|---|---|
| 6,504,270 B1 * | 1/2003 | Matshushita | ....... | H02M 3/33561 307/140 |
| 6,522,105 B2 * | 2/2003 | Kodama | ............... | H02J 7/1423 320/155 |
| 6,594,131 B2 * | 7/2003 | Umekawa | .......... | H03K 17/0822 327/310 |
| 6,605,925 B2 * | 8/2003 | Tange | ................... | H02J 7/0031 320/134 |
| 6,614,205 B2 * | 9/2003 | Nakashimo | ........... | H02J 7/0031 320/134 |
| 6,670,790 B2 | 12/2003 | Stellberger | | |

(Continued)

FOREIGN PATENT DOCUMENTS

| CN | 1614891 | 5/2005 |
|---|---|---|
| CN | 205901352 | 1/2017 |

(Continued)

OTHER PUBLICATIONS

Richard J Valentine, "Protection techniques ensure µC reliability in power-control circuits, " EDN Electrical Design News, vol. 41, No. 21, Oct. 10, 1996, pp. 1-16.

(Continued)

*Primary Examiner* — Helen Rossoshek
(74) *Attorney, Agent, or Firm* — JCIPRNET

(57) ABSTRACT

A power control circuit and a power control method are provided. The power control circuit includes a battery unit, a power controller and a switch circuit. The power controller is configured to provide a control signal. The switch circuit is coupled between the battery unit and the power controller. The switch circuit includes a diode component. The diode component is configured to receive the control signal. The switch circuit is configured to cut off a power transmission path of the battery unit in response to a voltage difference between a first terminal and a second terminal of the diode component.

8 Claims, 4 Drawing Sheets

(56) References Cited

U.S. PATENT DOCUMENTS

| | | | | |
|---|---|---|---|---|
| 7,486,049 B2 * | 2/2009 | Wan | ............. | H02J 7/0029 |
| | | | | 320/134 |
| 7,531,988 B2 * | 5/2009 | Sato | ............. | H02J 7/0029 |
| | | | | 320/134 |
| 7,791,316 B2 * | 9/2010 | Grunert | ............. | H02J 7/0068 |
| | | | | 320/138 |
| 8,896,161 B2 * | 11/2014 | Choi | ............. | H02J 7/35 |
| | | | | 307/150 |
| 9,252,750 B2 * | 2/2016 | Umeyama | ............. | H02J 9/06 |
| 9,318,910 B2 * | 4/2016 | Kim | ............. | H02J 7/007 |
| 9,479,060 B2 | 10/2016 | Deng | | |
| 9,729,061 B2 * | 8/2017 | Chen | ............. | H02M 1/38 |
| 9,811,062 B2 * | 11/2017 | Akebono | ............. | H03K 17/223 |
| 10,116,148 B2 * | 10/2018 | Kubota | ............. | H02H 7/18 |
| 2013/0076406 A1 | 3/2013 | Xu et al. | | |
| 2020/0259359 A1 * | 8/2020 | Hsia | ............. | H02J 7/007 |
| 2020/0395840 A1 * | 12/2020 | Goetz | ............. | H02M 1/08 |

FOREIGN PATENT DOCUMENTS

| | | |
|---|---|---|
| CN | 104252219 | 5/2018 |
| TW | 201515362 | 4/2015 |
| TW | M519348 | 3/2016 |

OTHER PUBLICATIONS

"Search Report of Europe Counterpart Application", dated Mar. 25, 2020, p. 1-p. 10.

* cited by examiner

POWER CONTROL CIRCUIT AND POWER CONTROL METHOD

CROSS-REFERENCE TO RELATED APPLICATION

This application claims the priority benefit of Taiwan application serial no. 108122721, filed on Jun. 27, 2019. The entirety of the above-mentioned patent application is hereby incorporated by reference herein and made a part of this specification.

BACKGROUND

Technical Field

The invention relates to a power control technique, and more particularly to a power control circuit and a power control method.

Description of Related Art

As the power consumption of electronic devices such as electric vehicles is increasing, the safety of battery modules is becoming more and more noticeable. When the output current of the battery module is excessive, a battery protection chip in the electronic device may activate a low voltage protection mechanism to stop the charging/discharging of the battery module in real time to avoid danger. At present, most battery modules use high-power field-effect transistors as switch circuits for the battery modules. However, in the low voltage protection mechanism, if the current flowing through the high-power field-effect transistor is large, the turn-off time of the high-power field-effect transistor may be prolonged (for example, several tens of thousandths of a second), resulting in damage to the high-power field-effect transistor or other electronic components.

SUMMARY

The invention provides a power control circuit and a power control method, which can effectively resolve the above problems.

Embodiments of the invention provide a power control circuit, including a battery unit, a power controller and a switch circuit. The power controller is configured to provide a control signal. The switch circuit is coupled between the battery unit and the power controller. The switch circuit includes a diode component. The diode component is configured to receive the control signal. The switch circuit is configured to cut off a power transmission path of the battery unit in response to a voltage difference between a first terminal and a second terminal of the diode component.

Embodiments of the invention further provide a power control method, including: providing a control signal by a power controller; receiving the control signal by a diode component; and cutting off a power transmission path of a battery unit in response to a voltage difference between a first terminal and a second terminal of the diode component.

Based on the above, the diode component in the switch circuit can receive the control signal from the power controller. In certain cases, in response to the voltage difference between the first terminal and the second terminal of the diode component, the power transmission path of the battery unit can be cut off. Thus, the delay time of cutting off the power transmission path of the battery unit can be effectively reduced, thereby improving the protection efficiency for other electronic components in the switch circuit, the battery unit and/or an electronic device.

In order to make the aforementioned and other objectives and advantages of the present invention comprehensible, embodiments accompanied with figures are described in detail below.

DESCRIPTION OF THE EMBODIMENTS

Figure 1:
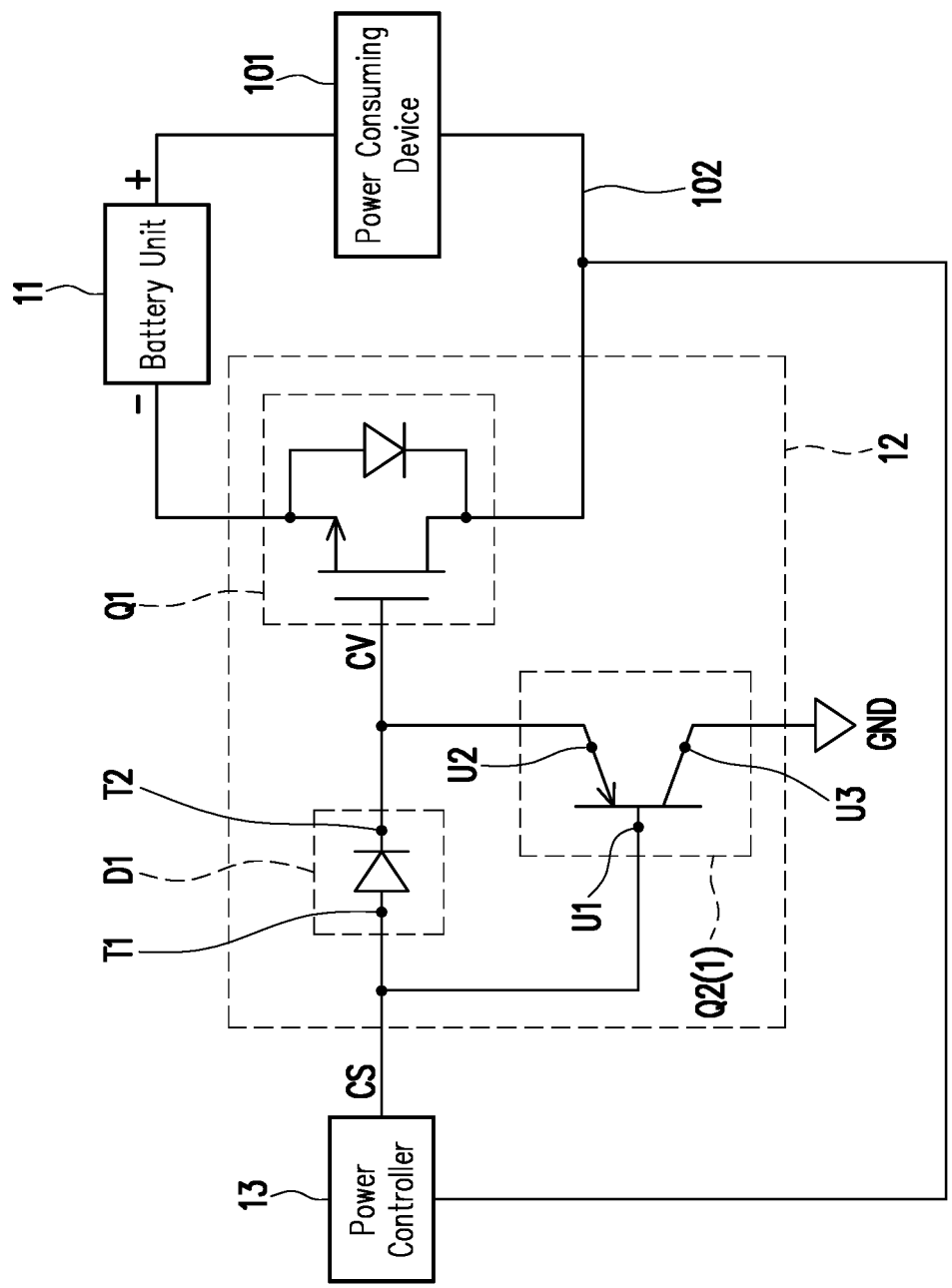
FIG. 1 is a schematic diagram of a power control circuit according to an embodiment of the invention.

FIG. 1 is a schematic diagram of a power control circuit according to an embodiment of the invention. Referring to FIG. 1, the power control circuit 10 may be disposed in various types of electronic devices of which a power consuming device 101 is powered by a battery unit 11, such as an electric vehicle, a notebook computer, a smart phone or the like. Taking the electric vehicle as an example, the power consuming device 101 may be an electronic device driven by power supplied by the battery unit 11, such as a vehicle instrument panel, a vehicle lamp, a power system, and/or a brake system, or the like. Alternatively, taking the notebook computer as an example, the power consuming device 101 may be a display, a central processing unit, a memory module, a communication module, and/or various functional circuits.

The power control circuit 10 includes a battery unit 11, a switch circuit 12 and a power controller 13. The battery unit 11 is configured to perform a discharging operation to supply power to the power consuming device 101. For example, the battery unit 11 may include at least one of a nickel-cadmium (Ni—Cd) battery, a nickel-metal hydride (Ni-MH) battery, a lithium ion (Li-ion) battery, a lithium polymer (Li-polymer) battery, and a lead acid (sealed) battery, and the type of the battery unit 11 is not limited thereto. Further, the number of batteries in the battery unit 11 may be one or more, which is not limited by the invention.

The power controller 13 may include one or more chips (or chipsets). For example, the power controller 13 may include a processor, or other programmable general purpose or special purpose microprocessor, a digital signal processor, a programmable controller, an application specific integrated circuit, a programmable logic device, or other similar devices, or combinations of these devices. In an embodiment, the power controller 13 is also referred to as a power management chip or a battery protection chip.

The switch circuit 12 is coupled between the battery unit 11 and the power controller 13. The power controller 13 may provide a control signal CS to the switch circuit 12. In particular, the power controller 13 may control the switch circuit 12 to turn on or cut off a power transmission path 102 of the battery unit 11 by the control signal CS. When the power transmission path 102 is turned on by the switch circuit 12, the battery unit 11 can supply power to the power consuming device 101 via the power transmission path 102. However, when the power transmission path 102 is cut off by the switch circuit 12, the battery unit 11 cannot supply power to the power consuming device 101 via the power transmission path 102.

In an embodiment, the power controller 13 may detect a current and/or a voltage on the power transmission path 102. The power controller 13 can determine whether to activate a low voltage protection mechanism, a high/low current protection mechanism, a temperature protection mechanism, and/or a short circuit protection mechanism according to the detected current and/or voltage. At least one of the above protection mechanisms may be referred to as a power protection mechanism. Under normal circumstances, the power controller 13 can maintain the switch circuit 12 to turn on the power transmission path 102 by the control signal CS, so that the battery unit 11 can normally supply power to the power consuming device 101.

However, when it is determined that the power protection mechanism needs to be activated (for example, when an abnormality occurs in the current and/or voltage on the power transmission path 102), the power controller 13 can change the voltage level of the control signal CS to control the switch circuit 12 to cut off the power transmission path 102. For example, the power controller 13 can adjust the voltage level of the control signal CS from logic high to logic low. In response to the voltage level of the control signal CS being adjusted from the logic high to the logic low, the switch circuit 12 can cut off the power transmission path 102. It should be noted that the speed and/or efficiency of the switch circuit 12 to cut off the power transmission path 102 is related to the efficiency and system safety of the power protection mechanism. If the switch circuit 12 cuts off the power transmission path 102 at a lower speed (e.g., 63.4 milliseconds), certain electronic components in the switch circuit 12 and/or the power consuming device 101 may be damaged before the power transmission path 102 is completely cut off.

In the present embodiment, the switch circuit 12 includes a diode component D1. The number of diode components D1 may be one or more. The diode component D1 can receive the control signal CS. The switch circuit 12 can cut off the power transmission path 102 in response to a voltage difference between a first terminal T1 (e.g., an input terminal) and a second terminal T2 (e.g., an output terminal) of the diode component D1. For example, the switch circuit 12 can detect a voltage difference between the first terminal T1 and the second terminal T2 of the diode component D1. At the moment when the power controller 13 changes the voltage level of the control signal CS, the voltage difference between the two terminals of the diode component D1 may be greater than a threshold. At this time, according to the voltage difference, the switch circuit 12 can instantaneously cut off the power transmission path 102.

In an embodiment, the switch circuit 12 can continuously compare the detected voltage difference with a threshold. If the detected voltage difference is greater than the threshold, it indicates that the power controller 13 has changed the voltage level of the control signal CS, so the switch circuit 12 can immediately cut off the power transmission path 102. In certain embodiments, it only takes about 0.5 to 6.05 microseconds to cut off the power transmission path 102 according to the voltage difference between the two terminals of the diode component D1, which greatly enhances the cut-off efficiency of the power transmission path 102. However, if the detected voltage difference is not greater than the threshold, the switch circuit 12 can maintain the power transmission path 102 in an on state.

In an embodiment, the switch circuit 12 further includes a transistor (also referred to as a first transistor) Q1. The transistor Q1 is coupled between the diode component D1 and the battery unit 11, as shown in FIG. 1. The transistor Q1 can be configured to turn on or cut off the power transmission path 102. For example, the transistor Q1 can be a high-power metal oxide semiconductor field-effect transistor (power MOSFET) or another electronic component with similar functions.

In an embodiment, the switch circuit 12 further includes a transistor (also referred to as a second transistor) Q2(1). The transistor Q2(1) is coupled between the diode component D1 and the transistor Q1, as shown in FIG. 1. The transistor Q2(1) can detect the voltage difference between the two terminals of the diode component D1 and change a control voltage CV of the transistor Q1 in response to the voltage difference. Next, the transistor Q1 can cut off the power transmission path 102 in response to a change in the control voltage CV.

In the embodiment of FIG. 1, a bipolar junction transistor (BJT) is used as an example of the transistor Q2(1). A first terminal U1 (e.g., a base) and a second terminal U2 (an emitter) of the transistor Q2 (1) are respectively coupled to the first terminal T1 (e.g., the input terminal) and the second terminal T2 (e.g., the output terminal) of the diode component D1 to detect the voltage difference between the two terminals of the diode component D1. In addition, a third terminal U3 (e.g., a collector) of the transistor Q2(1) is coupled to a reference ground voltage GND, as shown in FIG. 1.

If the voltage difference between the two terminals of the diode component D1 is greater than a threshold (e.g., 0.8 to 0.9 volt), the transistor Q2(1) can be turned on in response to the voltage difference. The turned-on transistor Q2(1) can change the control voltage CV of the transistor Q1 according to the reference ground voltage GND. For example, when the transistor Q2(1) is turned on, the transistor Q2(1) can instantaneously adjust the control voltage CV to be equal to or close to the reference ground voltage GND. At this time, the transistor Q1 can quickly cut off the power transmission path 102.

Figure 2:
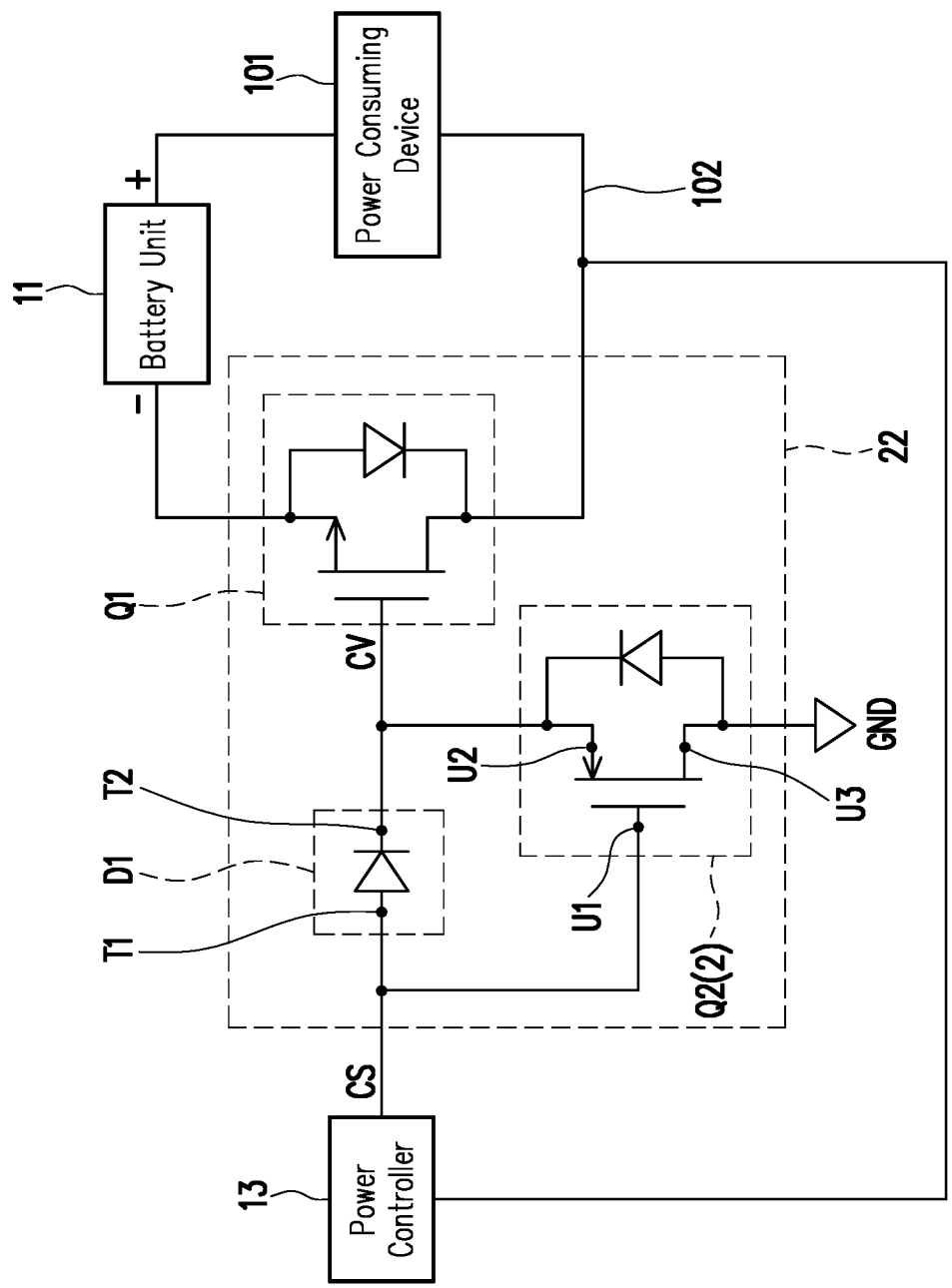
FIG. 2 is a schematic diagram of a power control circuit according to an embodiment of the invention.

FIG. 2 is a schematic diagram of a power control circuit according to an embodiment of the invention. Referring to FIG. 2, in comparison with the power control circuit 10 of FIG. 1, the power control circuit 20 includes a switch circuit 22, and a transistor Q2(2) in the switch circuit 22 is exemplified by a P-type metal oxide semiconductor field-effect transistor in the present embodiment. For the other electronic components with the same reference numerals, reference may be made to the description of the embodiment of FIG. 1, and the details are not repeated herein.

In the present embodiment, a first terminal U1 (e.g., a gate) and a second terminal U2 (source) of the transistor Q2(2) are respectively coupled to the first terminal T1 (e.g., the input terminal) and the second terminal T2 (e.g., the output terminal) of the diode component D1 to detect the voltage difference between the two terminals of the diode component D1. In addition, a third terminal U3 (e.g., a drain) of the transistor Q2 is coupled to the reference ground voltage GND, as shown in FIG. 2.

If the voltage difference between the two terminals of the diode component D1 is greater than a threshold (e.g., 1 to 3 volts), the transistor Q2(2) can be turned on in response to the voltage difference. Once the transistor Q2(2) is turned on, the transistor Q2(2) can instantaneously adjust the control voltage CV to be equal to or close to the reference ground voltage GND. In response to the change in the control voltage CV, the transistor Q1 can quickly cut off the power transmission path 102.

In other words, in the embodiments of FIG. 1 and FIG. 2, at the moment when the power controller 13 changes the voltage level of the control signal CS, the voltage difference between the two terminals of the diode component D1 may be greater than a threshold. Once the voltage difference between the two terminals of the diode component D1 is greater than the threshold, the transistor Q2(1) or Q2(2) can instantaneously pull the control voltage CV to be approximately equal to the reference ground voltage GND, causing the transistor Q1 to quickly cut off the power transmission path 102. Therefore, when an abnormal situation occurs (for example, voltage, current, and/or temperature abnormality), the power controller 13 can quickly activate the power protection mechanism with almost no delay, so as to effectively improve the protection capability for the switch circuit 12 (or 22) and/or the power consuming device 101.

Figure 3:
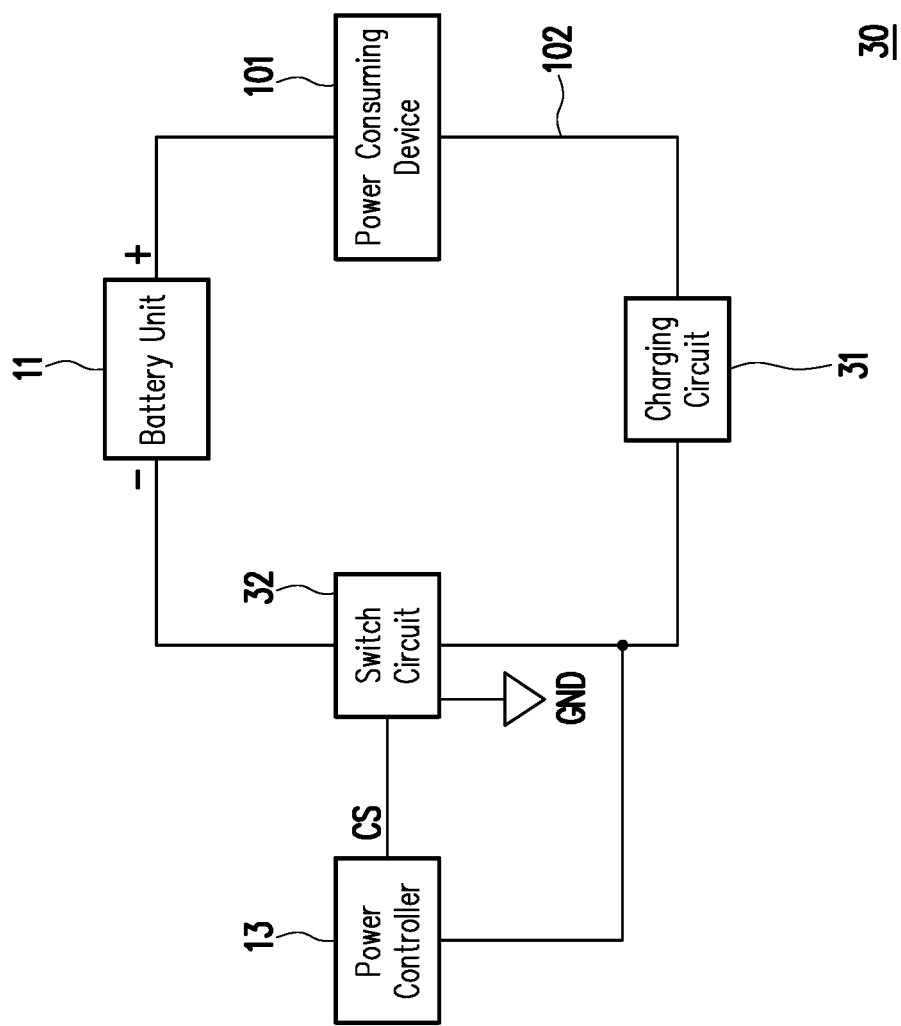
FIG. 3 is a schematic diagram of a power control circuit according to an embodiment of the invention.

FIG. 3 is a schematic diagram of a power control circuit according to an embodiment of the invention. Referring to FIG. 3, in comparison with the embodiments of FIG. 1 and FIG. 2, in the present embodiment, the power control circuit 30 further includes a charging circuit 31. When the switch circuit 32 maintains the power transmission path 102 in an on state, the charging circuit 31 can charge the battery unit 11 via the power transmission path 102.

However, when an abnormality occurs, the power controller 13 can change the control signal CS. In response to a change in the control signal CS, the switch circuit 32 can instantaneously cut off the power transmission path 102 by the reference ground voltage GND to activate the power protection mechanism. For details of related operations, reference may also be made to the embodiments of FIG. 1 and FIG. 2, and details are not repeated herein. In addition, after the power transmission path 102 is cut off, the charging circuit 31 cannot charge the battery unit 11.

It should be noted that although the number of transistors (for example, the transistor Q1) used as a switch in the switch circuits 12, 22 and 32 is 1 in the foregoing embodiments, the invention does not limit the number of transistors (e.g., the transistor Q1) used as the switch in the switch circuits 12, 22 and 32 in the foregoing embodiments. Taking FIG. 1 as an example, in an embodiment, if there are a plurality of transistors Q1, the transistors Q1 may be connected in parallel to the power transmission path 102, and the control voltage CV can be used to control each transistor Q1 to turn on or cut off the power transmission path 102.

It should be noted that in the foregoing embodiments, the cut-off of the power transmission path 102 does not need to be controlled by an additional control element (e.g., a microprocessor unit), thereby reducing the signal transmission delay and/or improving the efficiency of cutting off the power transmission path 102. In addition, in comparison with only one or more resistors connected in series between the transistor Q1 and the reference ground voltage GND, the transistor Q2(1) or Q2(2) connected in series between the transistor Q1 and the reference ground voltage GND in the foregoing embodiments can reduce leakage current between the transistor Q1 and the reference ground voltage GND.

Figure 4:
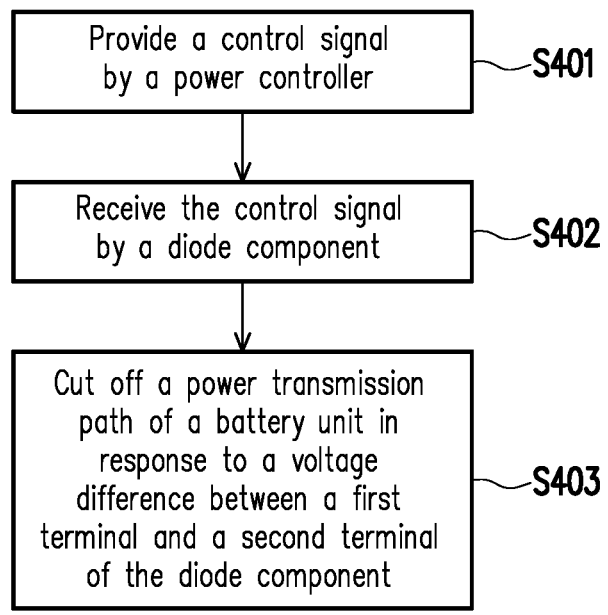
FIG. 4 is a flow chart of a power control method according to an embodiment of the invention.

FIG. 4 is a flow chart of a power control method according to an embodiment of the invention. Referring to FIG. 4, in step S401, a control signal is provided by a power controller. In step S402, the control signal is received by a diode component. In step S403, a power transmission path of a battery unit is cut off in response to a voltage difference between a first terminal and a second terminal of the diode component.

However, the steps in FIG. 4 have been described in detail as above, and will not be repeated here. It should be noted that the steps in FIG. 4 can be implemented as multiple program codes or circuits, which are not limited by the invention. In addition, the method of FIG. 4 may be used in combination with the above exemplary embodiments, or may be used alone, which is not limited by the invention.

Based on the above, the diode component disposed in the switch circuit can receive the control signal from the power controller. In certain cases, in response to the voltage difference between the first terminal and the second terminal of the diode component, the power transmission path of the battery unit can be cut off. Thus, the delay time of cutting off the power transmission path of the battery unit can be effectively reduced, thereby improving the protection efficiency for other electronic components in the switch circuit, the battery unit and/or an electronic device.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A power control circuit, comprising:
   a battery unit;
   a power controller, configured to provide a control signal; and
   a switch circuit, coupled between the battery unit and the power controller,
   wherein the switch circuit comprises:
      a diode component, configured to receive the control signal;
      a first transistor, coupled between the diode component and the battery unit and configured to turn on or cut off the power transmission path of the battery unit; and
      a second transistor, coupled to the diode component and the first transistor and configured to detect to a voltage difference between a first terminal and a second terminal of the diode component,
   wherein the first transistor cuts off the power transmission path of the battery unit in response to the voltage difference.

2. The power control circuit according to claim 1, wherein:
   the second transistor is configured to change a control voltage of the first transistor in response to the voltage difference, and
   the first transistor cuts off the power transmission path of the battery unit in response to a change in the control voltage.

3. The power control circuit according to claim 2, wherein a first terminal and a second terminal of the second transistor are respectively coupled to the first terminal and the second terminal of the diode component to detect the voltage difference,
   a third terminal of the second transistor is coupled to a reference ground voltage,
   the second transistor is turned on in response to the voltage difference, and
   the turned-on second transistor changes the control voltage of the first transistor according to the reference ground voltage.

4. The power control circuit according to claim 1, wherein the switch circuit cuts off the power transmission path of the battery unit in response to the voltage difference being greater than a threshold.

5. A power control method, comprising:
- providing a control signal by a power controller to a switch circuit, wherein the switch circuit is coupled between a battery unit and the power controller the switch circuit comprises a diode component, a first transistor coupled between the diode component and the battery unit, and a second transistor coupled to the diode component and the first transistor;
- receiving the control signal by the diode component;
- detecting a voltage difference between a first terminal and a second terminal of the diode component by the second transistor; and
- cutting off a power transmission path of a battery unit by the first transistor in response to the voltage difference.

6. The power control method according to claim 5, wherein the step of cutting off the power transmission path of the battery unit by the first transistor comprises:
- changing a control voltage of the first transistor by the second transistor in response to the voltage difference; and
- cutting off the power transmission path of the battery unit by the first transistor in response to a change in the control voltage.

7. The power control method according to claim 6, wherein the step of changing the control voltage of the first transistor by the second transistor in response to the voltage difference comprises:
- detecting the voltage difference by a first terminal and a second terminal of the second transistor;
- receiving a reference ground voltage by a third terminal of the second transistor;
- turning on the second transistor in response to the voltage difference; and
- changing the control voltage of the first transistor by the turned-on second transistor according to the reference ground voltage.

8. The power control method according to claim 5, wherein the step of cutting off the power transmission path of the battery unit by the first transistor in response to the voltage difference comprises:
- cutting off the power transmission path of the battery unit in response to the voltage difference being greater than a threshold.

* * * * *